United States Patent [19]

Suzuki

[11] Patent Number: 5,069,156
[45] Date of Patent: Dec. 3, 1991

[54] SPIN COATING APPARATUS FOR FORMING A PHOTORESIST FILM OVER A SUBSTRATE HAVING A NON-CIRCULAR OUTER SHAPE

[75] Inventor: Eiji Suzuki, Mizusawa, Japan

[73] Assignee: Fujitsu Limited, Kawasaki, Japan

[21] Appl. No.: 492,126

[22] Filed: Mar. 13, 1990

[30] Foreign Application Priority Data

Mar. 22, 1989 [JP] Japan ................................ 1-070076

[51] Int. Cl.$^5$ ............................................. B05C 11/08
[52] U.S. Cl. ...................................... 118/52; 118/320; 427/240
[58] Field of Search .................. 118/319, 320, 52; 427/240

[56] References Cited

U.S. PATENT DOCUMENTS

| | | | |
|---|---|---|---|
| 3,352,280 | 11/1967 | Hughes et al. | 118/319 X |
| 3,870,014 | 3/1975 | Buck | 118/52 |
| 4,280,442 | 7/1981 | Johnson | 118/52 |
| 4,416,213 | 11/1983 | Sakiya | 118/52 |
| 4,790,262 | 12/1988 | Nakayama et al. | 118/320 X |

FOREIGN PATENT DOCUMENTS

| | | | |
|---|---|---|---|
| 55-2720 | 1/1980 | Japan | 118/319 |
| 60-143871 | 7/1985 | Japan | 118/319 |
| 60-143872 | 7/1985 | Japan | 118/319 |

*Primary Examiner*—Richard L. Chiesa
*Attorney, Agent, or Firm*—Staas & Halsey

[57] ABSTRACT

A spin coating apparatus having a rotatable supporting disk for supporting a non-circular substrate thereon and an annular member having an inward overhanging inner wall, being coaxially fixed to the peripheral portion of the disk so as to surround the substrate. The height of the annular member is selected so that the top surface of the substrate is recessed from the top end portion of the annular member by a predetermined depth. The apparatus is suitable for coating a liquid photoresist film over a non-circular substrate, and providing the film with an acceptable uniform thickness over the entire film in spite of turbulent air flow which is caused adjacent to the substrate by the side walls of the non-circular substrate.

9 Claims, 2 Drawing Sheets

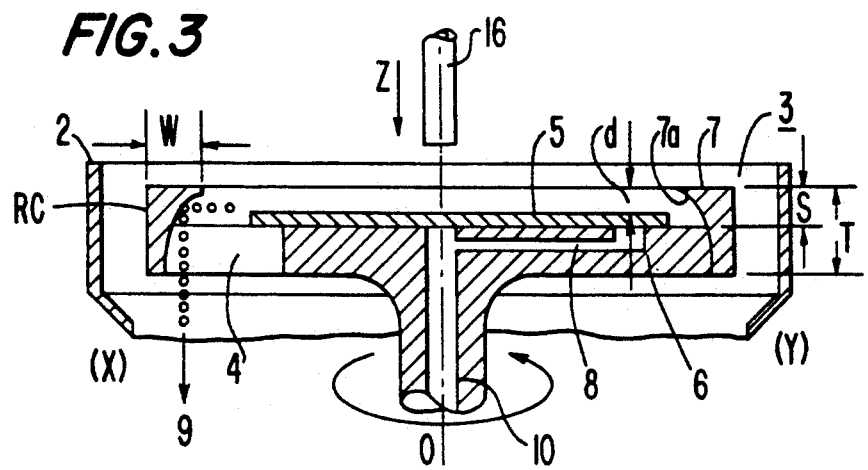
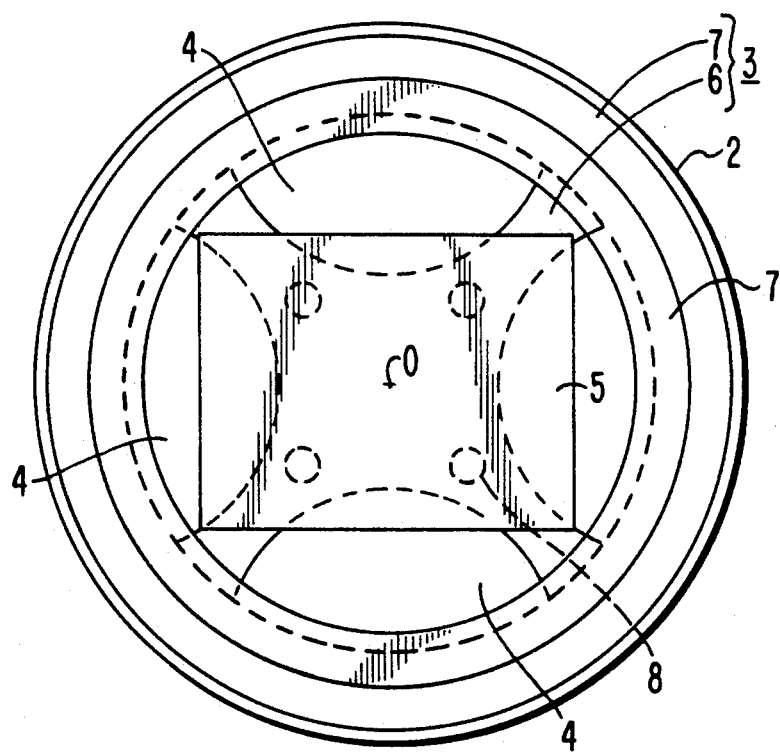
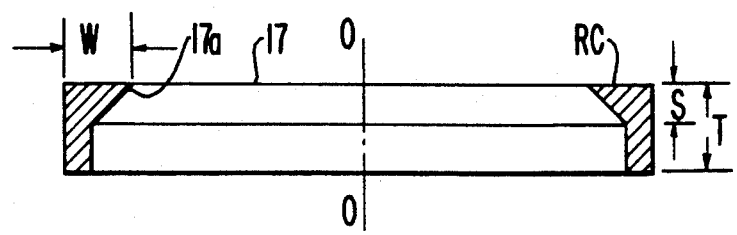

SPIN COATING APPARATUS FOR FORMING A PHOTORESIST FILM OVER A SUBSTRATE HAVING A NON-CIRCULAR OUTER SHAPE

BACKGROUND OF THE INVENTION

The present invention relates to a spin coating apparatus (hereinafter referred to as a spinner) for manufacturing an electronic device such as an integrated circuit (IC) device. Particularly, it relates to a spinner suitable for forming a photoresist layer having an acceptable uniform thickness over a substrate with a non-circular outer shape.

Recently, as miniaturization and an increase in the packing density of semiconductor integrated circuit devices have been promoted, the pattern of circuits formed on a semiconductor substrate or the pattern of the associated mask, has become extremely fine such as of a submicron order. On the other hand, the size of the substrate has been enlarged, such as a wafer of eight inches in diameter, for example, to achieve cost reduction in the mass production of the associated devices. As a result, fine and precise pattern formation over the surface of a substrate having a substantially large area is required in the field. There is similar requirement in the other fields such as manufacturing of liquid crystal display devices and electro-luminescence (EL) devices. In order to meet this requirement, a great deal of effort for developing production technology to realize such fine pattern formation in a large area has been made in the field.

A technology referred to as photolithography is widely used at present, wherein patterning of circuits and photomasks is performed with a photo-etching technology. In current photolithography, a film of photo-etch resist resin (hereinafter referred to as photoresist) is widely used. In a fabrication step of a semiconductor device or other products, photoresist is currently used as a material of a patterning film coated on a substrate such as a semiconductor substrate or a reticule substrate.

There are various methods for coating photoresist film over a substrate, such as spin coating, spray coating, dip coating and roll coating. As the pattern becomes finer, the thickness of the photoresist film must be reduced in line with the width of a line contained in the pattern. For coating a thin photoresist film on a substrate having a large area, the spin coating is most suitable to provide the film with substantially uniform thickness throughout the entire area of the film. For spin coating of a photoresist film on a substrate, a spinner is used.

FIG. 1 is a schematic perspective view of a spinner of the prior art, illustrating the structure thereof. The spinner 11 comprises a rapidly rotatable turntable 13 on which a substrate 15 to be coated is held thereon using a vacuum chucking means. The vacuum is made by an evacuating device (not shown) and applied to the substrate 15 through suction holes 14. The turntable 13 is surrounded by a spin cup 12 coaxially disposed with respect to the rotating axis 0—0 of the turntable 13. Liquid photoresist is supplied from a photoresist source (not shown) and dropped on the center portion of the rotating turntable 13 through a nozzle (not shown). The dropped liquid photoresist spreads outwardly over the surface of the substrate 15 in rotation by centrifugal forces caused by rotation, and any excess supply of the photoresist is hurled off the turntable 13, and received by the spin cup 12 and drained downwardly. The thickness of thus formed photoresist film over the substrate 15 is adjusted by balancing the viscosity of the liquid photoresist and the centrifugal force caused by the rotation of the turntable 13. In the prior art spinners, in general the turntable employed has a disk having a flat top surface with no protrusion to avoid disturbing the spreading flow of the liquid photoresist during spin operation.

When a circular substrate such as a circular semiconductor wafer is coated with a photoresist film using the prior art spinner 11, the thickness of the coated film is favorably uniform. The thickness of a photoresist film coated on a non-circular substrate, such as a rectangular substrate 15 as shown in FIG. 1, however, is rather non-uniform, and further, rippled portions 18 are caused in the peripheral area of the substrate 15. This is considered to be caused by turbulent air flow adjacent to the top surface of the spinning substrate.

Generally, air contacting with the surface of a rotating body is driven to cause an air flow which runs in the same rotating direction as that of the body. The air flow is caused by the friction between the surface of the rotating body and air contacting with the surface.

The side wall of a spinning substrate also causes an air flow. When the substrate is circular, the air flow along the side wall always runs in parallel with the side wall of the substrate, resulting in a laminated flow which does not disturb the air flow adjacent to the top surface of the circular substrate. Hence, the liquid photoresist spreading over the surface of the substrate is subject to aerodynamic forces substantially being symmetrical around the rotating axis 0—0. This is favorable to make the photoresist film have a substantially uniform thickness.

When a rectangular substrate such as the substrate 15 of FIG. 1 is spun, the side walls of the rectangular substrate cause air flows with various directions and speeds, generating a turbulent flow which disturbs the air flow adjacent to the top surface of the substrate, particularly of the peripheral portion of the substrate. It is considered that the ripple marks 18 of FIG. 1 are caused by the above-described turbulent air flow exerting undesirable aerodynamic forces to the liquid photoresist film. It should be noted that the intensity of the aerodynamic forces depends on the difference between the surface speed of the film and that of the air flow adjacent to the film, namely the speed of the air flow relative to the film. As the relative speed of the air flow adjacent to a liquid photo-resist film is decreased, aerodynamic forces caused by the air flow and exerted on the film, are reduced.

In order to overcome the above-described problem with respect to the spin coating of a photoresist film over a non-circular substrate, a spinner is disclosed by Wada, in an Unexamined Japanese Patent Application, No. 55-02720, published on Jan. 10, 1980. The spinner of Wada has a modified turntable which has a portion recessed from the major top surface of the turntable. The depth and outer shape of the recessed portion are selected to coincide with those of a non-circular substrate to be processed. The substrate is loaded in the recessed portion with the result that the major top surface of the turntable and the top surface of the substrate are substantially in the same plane. This configuration serves to prevent the above-described turbulent air flow which would be caused by the side walls of the substrate. However, there is a disadvantage that at the edge portion of the substrate, the coated photoresist film tends to be damaged when the substrate is unloaded from the turntable.

Another spinner is disclosed by Yamamoto in Unexamined Japanese Patent Application No. 60-143872, published on July 30, 1985. The spinner of Yamamoto has a rotary turntable and rotary vanes rotating synchronously and coaxially with the turntable for generating an air stream which is directed downward at the outside of the turntable. The vanes are intended to change the direction of air flow caused by the rotation of the turntable. However, the generated air flow does not appear to improve the uniformity of the photoresist film.

SUMMARY OF THE INVENTION

The principal object of the present invention is to provide a spinner capable of forming a film of viscous liquid having a substantially uniform thickness over a substrate with large area and a non-circular outer shape.

Another object of the present invention is to provide a spinner having means for suppressing the speed of turbulent air flow which is caused adjacent to the surface of a rotating substrate having a non-circular outer shape.

A spinner according to the present invention, has a turntable fixed to a rotating shaft, and is surrounded by a spin cup. The turntable has a rotatable supporting disk having plural openings for draining excess liquid photoresist therethrough, and vacuum chuck means to hold a substrate to be processed on the supporting disk. A primary feature of the spinner of the present invention is that the turntable of the spinner further has an annular member coaxially disposed with respect to the supporting disk. The annular member surrounds the supporting disk and the substrate loaded thereon, in a somewhat embraced manner. The height of the annular member is selected so that the top surface of the substrate loaded on the supporting disk, is sunk sufficiently under the top end of the annular member by a predetermined depth. The inner wall of the annular member has a surface of revolution. The inner wall is extended radially inwardly in a overhanging manner, and has a top opening to allow loading and unloading of the substrate therein.

As a result, during spin coating of a photoresist film over a non-circular substrate employing a spinner according to the present invention, the above-described turbulent air flow is caused, but the relative speed of the turbulent air flow to the surface of the film is favorably suppressed because the inner wall surface of the annular member rotating in synchronization with the supporting disk, drives air adjacent to the peripheral portion of the substrate in the same rotating direction.

These and other, objects and advantages, which will be subsequently apparent, reside in the details of construction and operation as more fully hereinafter described and claimed, with reference to the accompanying drawings wherein like reference letters refer to like parts throughout.

BRIEF DESCRIPTION OF THE DRAWINGS

FIG. 3 is a cross-sectional view of the spinner of FIG. 2 taken along the line X-O-Y shown in FIG. 2;

FIG. 4 is a plan view of the spinner of FIG. 2 taken in the direction Z shown in FIG. 2; and FIG. 5 is a cross-sectional view of a modified annular member, illustrating a modified pattern of the radial cross-section thereof.

DETAILED DESCRIPTION OF THE PREFERRED EMBODIMENT

Figure 1:
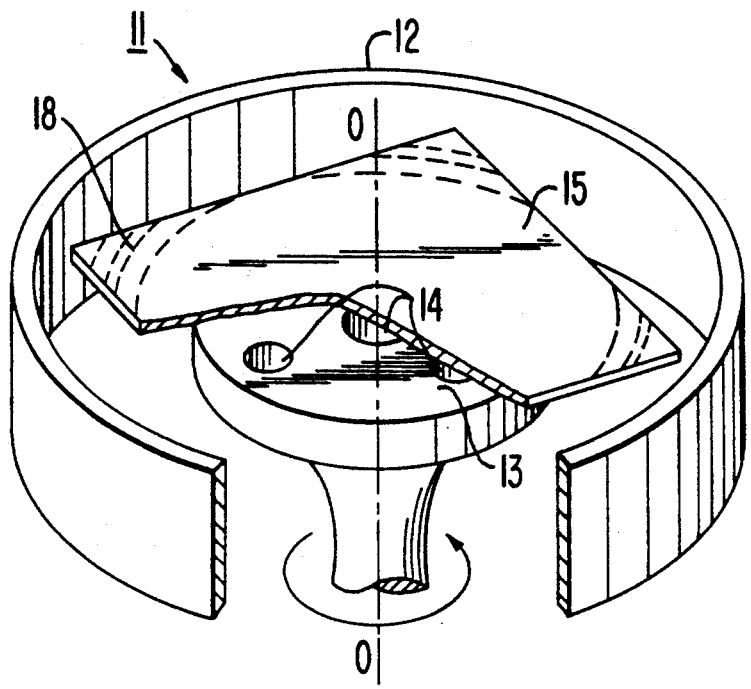
FIG. 1 is a schematic perspective view of a spinner of the prior art, illustrating the structure thereof.

The spinner 1 comprises a spin cup 2 and a turntable 3, both of which are rotatably disposed around a common axis 0—0. The spin cup 2 is fixed to a base portion (not shown) of the spinner 1 and is made of a stainless steel plate having a thickness of 0.2 mm and having a diameter of 250 mm. At the lower portion of the spin cup 2, a drain device (not shown) is disposed for collecting used excess liquid photoresist.

The turntable 3 comprises a supporting disk 6 and a annular member 7 (a ring member). The supporting disk 6 is made of aluminum, stainless steel, or fluorocarbon resin such as Teflon, and is 190 mm in diameter and 10 mm in thickness. In the peripheral portion of the supporting disk 6, four openings 4 are provided at equally separated positions. Each opening 4, as shown in FIG. 4, is in the shape of a partially cut circle having a radius of 50 mm. The supporting disk 6 is coupled to a shaft (not shown) which is driven to rotate around the axis 0—0 by a driving motor (not shown). A hole 10 is formed through the shaft and the supporting disk 6, which is connected to a vacuum device (not shown) disposed in a lower portion of the spinner 1, and has four branch holes 8 connected thereto which open in the top surface of the supporting disk 6. The above-described structures are known in the field.

The feature of the present invention lies in the annular member 7 which is fixed to the supporting disk 6 at the outer side wall thereof. The angular member 7 has a top end portion and a free or upper end portion allowing loading and unloading of the substrate. The annular member 7 has an upper portion S of 10 mm in the axial direction and a thickness T of 20 mm as shown in FIG. 3. The inner wall 7 is imperforate and of the annular member 7a is a surface of revolution, the radial cross-section RC of which has an overhanging curved pattern toward the axis 0—0 as shown in FIG. 3.

A rectangular substrate 5 is held on the supporting disk 6 by vacuum chucking. The supporting disk 6 and the annular member 7 are spun at a predetermined rotating speed. Liquid photoresist then is supplied from a photoresist source (not shown) and dropped on the center portion of the supporting disk 6 through a nozzle 16. As a result, the drops of the photoresist spread over the surface of the rectangular substrate 5. The excess liquid photoresist 9 is radially hurled off the substrate 5 and the top surface of the supporting disk 6 and received by the inner wall 7a at a downward directed portion thereof, turning its direction downward so as to be easily drained and collected by the drain device.

Figure 2:
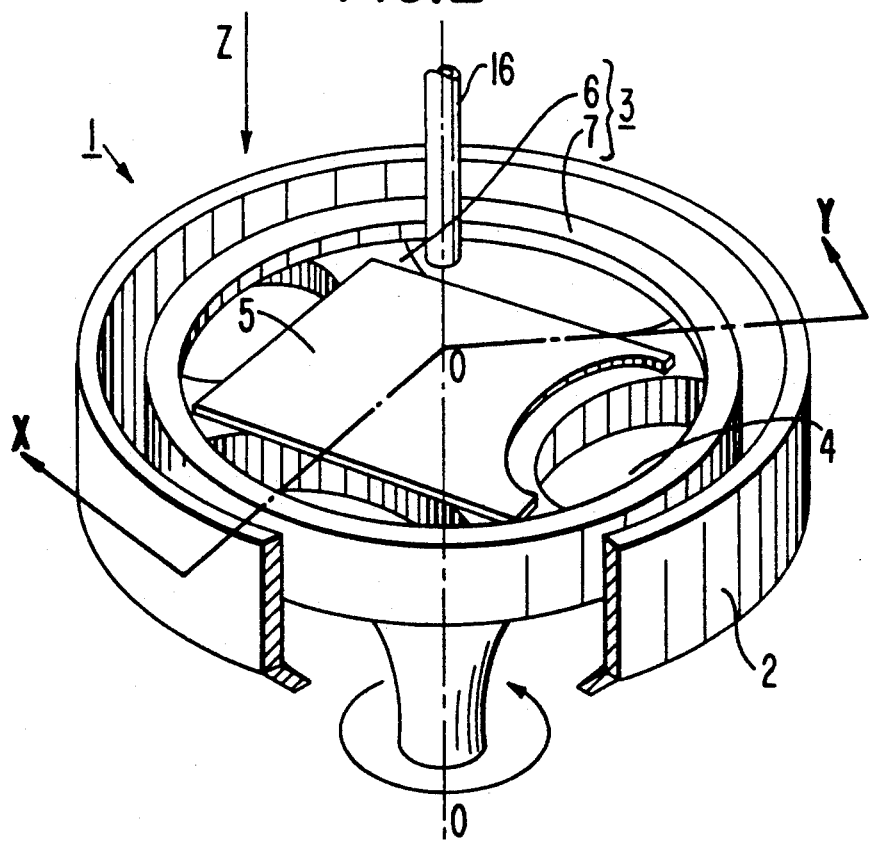
FIG. 2 is a partially broken perspective view of a spinner according to the present invention.

The physical aspect of the above-described spin coating using the spinner 1 according to the present invention will be described with reference to the drawings of FIG. 2 through FIG. 4. Since the substrate 5 loaded on the turntable 3 rotates at a high speed and has a rectangular outer shape, turbulent air flow is caused by the side walls of the substrate 5 as previously described. At the same time, air adjacent to the flat surfaces of the supporting disk 6 and the substrate 5, and the surface of the inner wall 7a of the annular member 7, is driven to flow by friction between the air and the surfaces. The air flow rotates in the same rotating direction of the turntable 3 with the result that the relative speed of the air flow to the surface of the substrate 5 is favorably reduced. Consequently, the undesirable aerodynamic forces exerted on the photoresist film by the turbulent air flow are suppressed. Thus, the adverse effect of the turbulent air flow on the photoresist film is considerably reduced, and the uniformity of the thickness of the photoresist film is favorably improved.

After the spin coating, the substrate 5 is unloaded from the turntable 3 and dried in an oven (not shown) to turn the liquid photoresist film coated thereon to a semisolid photoresist layer.

We repeated a number of experiments of spin coating using the above-described spinner 1. A square reticule substrate of glass having a side of 126 mm in length was coated with photoresist film 0.5 microns thick. The spinning speed was 3000 rpm. The uniformity of the coated photoresist film was measured with the result that fluctuation of the thickness of the film was within 2% or less throughout, all the experiments. By comparison, when employing a conventional spinner, we found that the uniformity of the thickness of photoresist films was unfavorable, ranging from 10% to 15%.

In view of the above-described function for generating a rotating air flow adjacent to the substrate 5, the top surface of a substrate loaded on the supporting disk 6 must recess from the top end surface of the annular member 7 by a step difference d as shown in FIG. 3, and the surface area of a portion of the inner wall 7a of the annular member 7 which protrudes from the top surface of the substrate 5 is desirable to be as large as possible. In other words, the step difference d of FIG. 3 should be larger than a dimension which is experimentally determined. In the embodiment of FIG. 3, d is taken as 5 mm. Of course, the step difference d varies in conjunction with other dimensions such as that of the substrate 5, the diameter of the supporting disk 6, and the like. According to experiments, a depth d of 50 mm provides a substantially favorable result, although the step difference, namely the depth of 50 mm may cause some inconvenience for handling the substrate.

Since the speed of the rotating air flow decreases as the flow is apart from the inner surface 7a of the annular member 7, the relative speed of the air flow to the surface of the body increases at the portions apart from the inner surface 7a. The inner surface 7a, therefore, is also desirable to be disposed as close to the substrate 5 as possible.

Various modification of the turntable 3 can be made. The supporting disk 6 and the annular member 7 can be made in one body by cutting a rod of stainless steel. In particular, the pattern of the radial cross section RC can be formed in another shape as shown in the cross-sectional view of the annular member 17 shown in FIG. 5. The inner wall 17a of FIG. 5 has a conical surface. Excess liquid photoresist is radially hurled off the substrate and the top surface of the supporting disk and received by the inner wall 17a at a downwardly directed portion of the conical surface, turning its direction downward so as to be easily drained.

The extended width W of the top portion of the pattern RC, namely, that of the annular members 7 and 17 is also useful to prevent splashing of excess liquid photoresist 9 from contaminating the photoresist film coated on the substrate 5.

What we claim is:

1. A spin coating apparatus for forming a film of a liquid coating material over a substrate, said apparatus comprising:
    spinning means for holding and spinning said substrate around an axis;
    cup means surrounding said spinning means; and
    dispensing means for applying said coating material over the center portion of the surface of said substrate while said substrate is spinning, whereby said coating material is spread along the surface of said substrate,
    said spinning means comprising:
    turntable means for holding said substrate thereon and spinning said substrate, said turntable means comprising;
    a supporting disk rotatable around said axis, said supporting disk having a flat top surface on which said substrate is held by vacuum chucking;
    a plurality of openings provided in the peripheral portion of said supporting disk; and
    an annular member coaxially fixed to said supporting disk and having a top end portion, a free end opening allowing loading and unloading of said substrate, and an imperforate inner circular wall with a surface of revolution, said inner circular wall overhanging toward said axis, whereby, when said substrate is loaded on said supporting disk, the top surface of said substrate is recessed from said top end portion of said annular member and toward said supporting disk by a predetermined depth.

2. A spin coating apparatus of claim 1, wherein said coating material is a photoresist material.

3. A spin coating apparatus of claim 1, wherein the shape of said substrate is rectangular.

4. A spin coating apparatus of claim 1, wherein said substrate is a semiconductor substrate.

5. A spin coating apparatus of claim 4, wherein said semiconductor substrate is a circular wafer with a flat orientation.

6. A spin coating apparatus of claim 1, wherein said substrate is a reticule.

7. A spin coating apparatus of claim 1, wherein said supporting disk has openings provided on said flat surface.

8. A spin coating apparatus of claim 1, wherein said supporting disk and said annular member are made of stainless steel.

9. A spin coating apparatus for coating photoresist material over a substrate, said apparatus comprising:
    dispensing means for applying said photoresist material to said substrate;
    a cup member;
    a turntable rotatably driven inside said cup member, said turntable including:
    a supporting disk member having a plurality of openings in the peripheral portion thereof to allow the excess of said photoresist material to be drained therethrough and being capable of holding said substrate thereon by vacuum chucking, and
    an annular member fixed on said peripheral portion of said supporting disk member, said annular member having an imperforate inner circular wall with a surface of revolution, said inner circular wall overhanging toward the inside to cause said photoresist material splashing against said inner circular wall to drain downwardly, said annular member having a height so that said substrate held on said supporting disk member does not protrude from the top end of said annular member.

* * * * *

UNITED STATES PATENT AND TRADEMARK OFFICE
CERTIFICATE OF CORRECTION

PATENT NO. : 5,069,156
DATED : December 3, 1991
INVENTOR(S) : EIJI SUZUKI

It is certified that error appears in the above-identified patent and that said Letters Patent is hereby corrected as shown below:

Column 4, lines 41 and 42, "7 is imperforate and of the annular member 7a" should be --7a of the annual member 7 is imperforate and--

Signed and Sealed this

Eighth Day of June, 1993

Attest:

MICHAEL K. KIRK

Attesting Officer    Acting Commissioner of Patents and Trademarks